US010354876B1

(12) United States Patent
Chang et al.

(10) Patent No.: US 10,354,876 B1
(45) Date of Patent: Jul. 16, 2019

(54) SEMICONDUCTOR DEVICE AND METHOD OF FORMING THE SAME

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Yu-Cheng Tung, Kaohsiung (TW); Fu-Che Lee, Taichung (TW); Ying-Chih Lin, Tainan (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/016,647

(22) Filed: Jun. 24, 2018

(30) Foreign Application Priority Data

May 24, 2018 (CN) .......................... 2018 1 0509842

(51) Int. Cl.
*H01L 21/033* (2006.01)
*H01L 27/108* (2006.01)

(52) U.S. Cl.
CPC ...... *H01L 21/0337* (2013.01); *H01L 27/1085* (2013.01)

(58) Field of Classification Search
CPC .......... H01L 21/7681; H01L 21/76811; H01L 21/027–21/0338; H01L 21/32; H01L 21/0273–21/0279; H01L 21/312–21/3128; H01L 21/0337; H01L 27/1085
See application file for complete search history.

(56) References Cited

U.S. PATENT DOCUMENTS

| 9,679,901 B1 | 6/2017 | Wang et al. | |
| 2016/0196982 A1* | 7/2016 | Kang | ................. H01L 21/02595 438/702 |
| 2018/0182845 A1* | 6/2018 | Seong | ................. H01L 27/0924 |

* cited by examiner

*Primary Examiner* — Didarul A Mazumder
*Assistant Examiner* — Wasiul Haider
(74) *Attorney, Agent, or Firm* — Winston Hsu

(57) ABSTRACT

A semiconductor device and a method of forming the same, the semiconductor device includes a substrate and a material layer. The substrate has a first region, and the material layer is disposed on the substrate. The material layer includes plural of first patterns and plural of second patterns arranged in an array, and two third patterns. The first patterns are disposed within the first region, the second patterns are disposed at two opposite outer sides of the first region, and the third patterns are disposed at another two opposite outer sides of the first region, wherein each of the third patterns partially merges each of a part of the first patterns and each of a part of the second patterns.

20 Claims, 13 Drawing Sheets

SEMICONDUCTOR DEVICE AND METHOD OF FORMING THE SAME

BACKGROUND OF THE INVENTION

1. Field of the Invention

The present invention relates to a method of forming a semiconductor device, and more particularly to a method of forming a semiconductor device through a multiple patterning process.

2. Description of the Prior Art

Fabrication of microstructures requires tiny elements of precisely controlled size formed in a material layer of an appropriate substrate such as semiconductor substrate/layers, dielectric layers and/or metal layers. These tiny elements are generated by patterning the abovementioned substrate/layers, for instance, by performing photolithography and etching processes. For this purpose, in conventional semiconductor techniques, a mask layer is formed on the target, and these tiny elements are defined in the mask layer and followed by being transferred to the target layer. Generally, the mask layer may include or is formed by means of a layer of photoresist that is patterned by lithographic process and/or patterned hard mask including the patterns transferred from the patterned photoresist.

As feature sizes are decreased by the complexity of currently integrated circuits, the existing single patterning process has met its bottleneck to successfully render the features. That is, the overlay accuracy and the resolution among this feature have to push the lithographic limit further to create even smaller, more densely packed devices. Therefore, it is still urgent to those of skilled in the art to develop or improve the conventional scheme for these tiny elements.

SUMMARY OF THE INVENTION

It is one of the primary objectives of the present invention to provide a semiconductor device and a method of forming the same, in which a multiple patterning process such as a sidewall image transfer (SIT) technique is utilized to form intertwined patterns. That is, a smaller, more densely packed device may be formed under a simplified process flow using a reduced number of photomasks.

To achieve the purpose described above, the present invention provides a semiconductor device including a substrate and a material layer. The substrate has a first region, and the material layer is disposed on the substrate. The material layer includes a plurality of first patterns and a plurality of second patterns arranged in an array, and two third patterns. The first patterns are disposed within the first region, the second patterns are disposed at two opposite outer sides of the first region, and the two third patterns are disposed at another two opposite outer sides of the first region. Each of the third patterns partially merges each of a part of the first patterns and each of a part of the second patterns.

To achieve the purpose described above, the present invention provides a method of forming a semiconductor device including the following steps. First of all, a substrate having a first region is provided. Next, a material layer is formed on the substrate. Then, the material layer is patterned to forming a plurality of first patterns and a plurality of second patterns arranged in an array, and two third patterns. The first patterns are formed within the first region, the second patterns are formed at two opposite outer sides of the first region, and the two third patterns are formed at another two opposite outer sides of the first region. Each of the third patterns partially merges each of a part of the first patterns and each of a part of the second patterns.

Overall speaking, the present invention utilizes a multiple patterning process such as a SIT process and a double patterning process, to form photomask patterns which are crossed with each other, and to form corresponding patterns in a target layer through these crossed portions of the photomask patterns. In this way, through further adjusting the shape, the crossed relation and the extending direction of each photomask patterns, it is sufficient to form an ideal finer structure with smaller and compact layout via the SIT process and the double patterning process, under a simplified and cost-reduced process flow. Thus, the method of the present invention may be practical applied on a semiconductor process, for example a process of a semiconductor memory device like a dynamic random access memory (DRAM) device, to form the pads electrically connected to each storage node contact (SNC).

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 are schematic diagrams illustrating a method of forming a semiconductor device according to a first embodiment of the present invention, in which:

FIG. 1 shows a photomask of the method forming a semiconductor device according to the first embodiment of the present invention;

FIG. 2 shows a top view of a semiconductor device after forming a first photoresist structure;

FIG. 3 shows a cross-sectional view of a semiconductor device after forming a first photoresist structure;

FIG. 4 shows a cross-sectional view of a semiconductor device after performing a patterning process;

FIG. 5 shows a top view of a semiconductor device after performing another patterning process; and FIG. 6 shows a top view of a semiconductor device after forming patterns.

FIG. 7 to FIG. 8 are schematic diagrams illustrating a method of forming a semiconductor device according to a second embodiment of the present invention, in which:

FIG. 7 shows a photomask of the method forming a semiconductor device according to the second embodiment of the present invention; and FIG. 8 shows a top view of a semiconductor device after forming patterns.

FIG. 9 to FIG. 11 are schematic diagrams illustrating a method of forming a semiconductor device according to a third embodiment of the present invention, in which:

FIG. 9 shows a photomask of the method forming a semiconductor device according to the third embodiment of the present invention;

FIG. 10 shows a top view of a semiconductor device after forming a mask pattern;

FIG. 11 shows a top view of a semiconductor device after forming patterns.

FIG. 13 to FIG. 14 are schematic diagrams illustrating a method of forming a semiconductor device according to a fourth embodiment of the present invention, in which:

FIG. 13 shows a photomask of the method forming a semiconductor device according to the fourth embodiment of the present invention;

FIG. 14 shows a top view of a semiconductor device after forming patterns.

DETAILED DESCRIPTION

To provide a better understanding of the presented invention, preferred embodiments will be described in detail. The preferred embodiments of the present invention are illustrated in the accompanying drawings with numbered elements.

Figure 1:
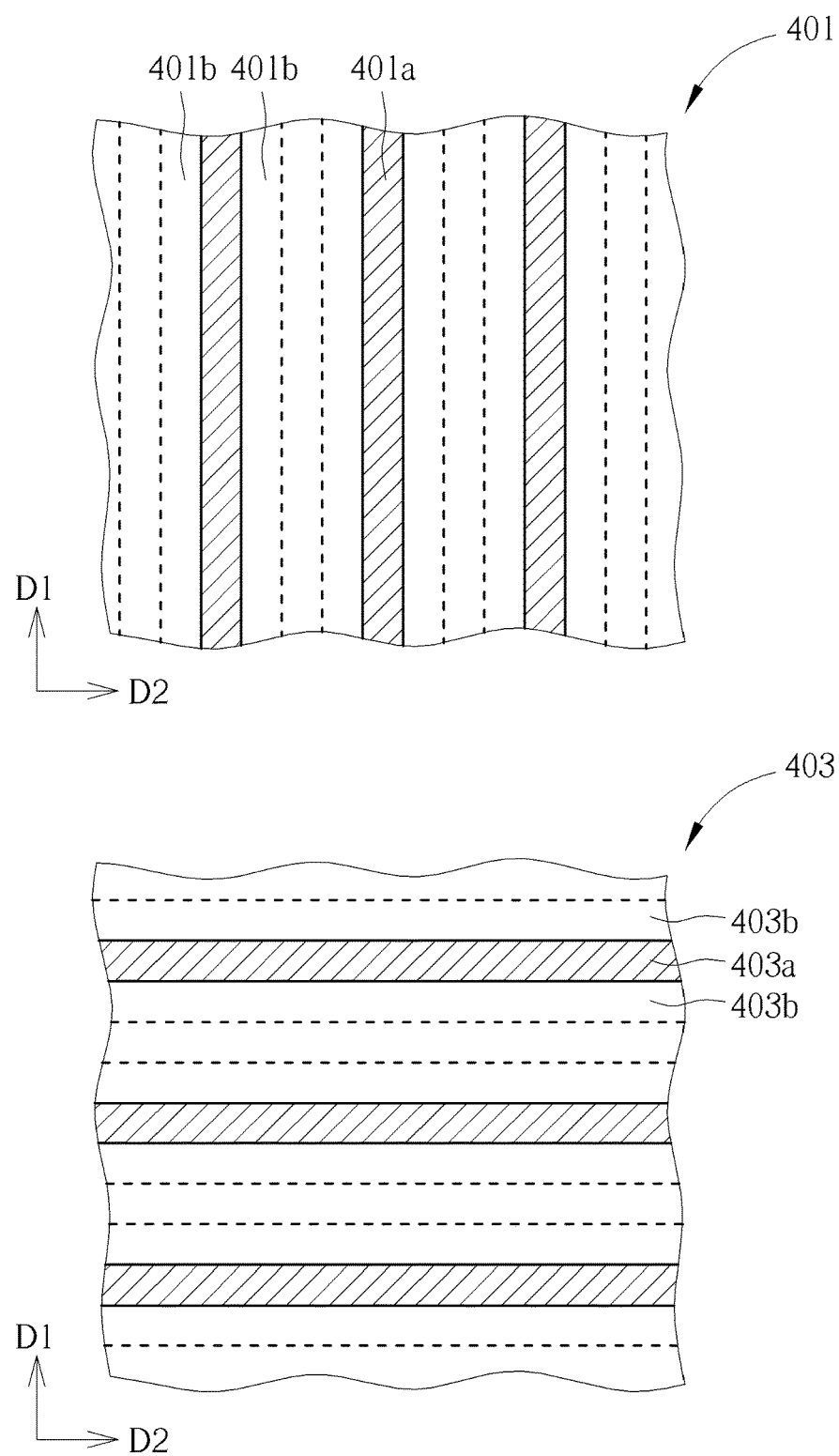
Figure 2:
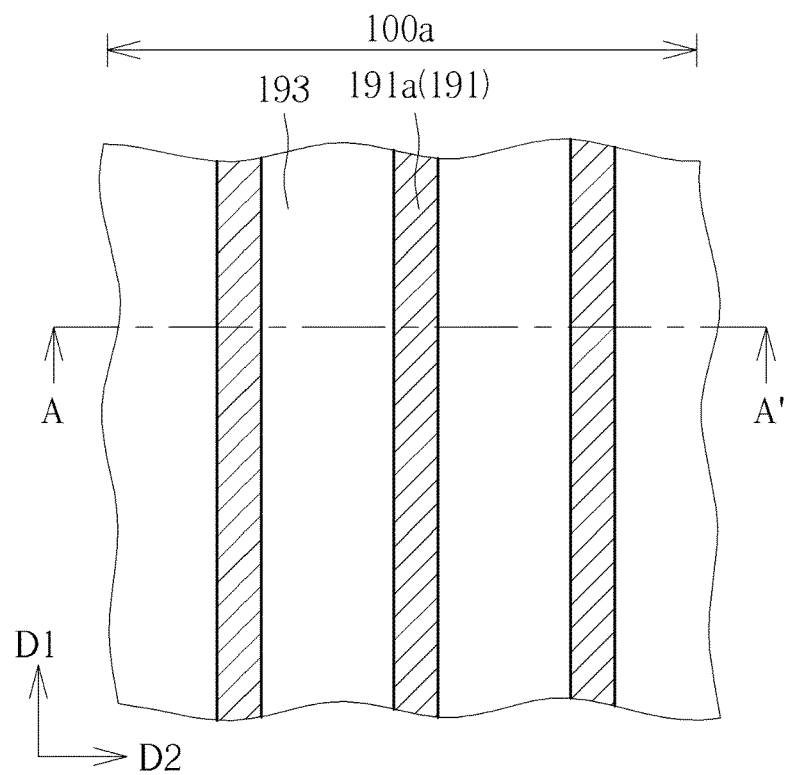
Figure 3:
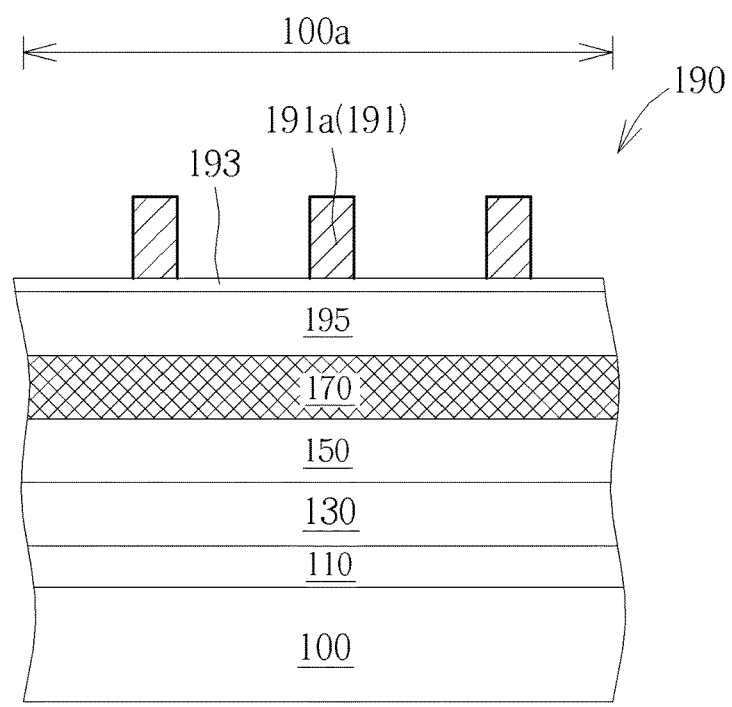
Figure 4:
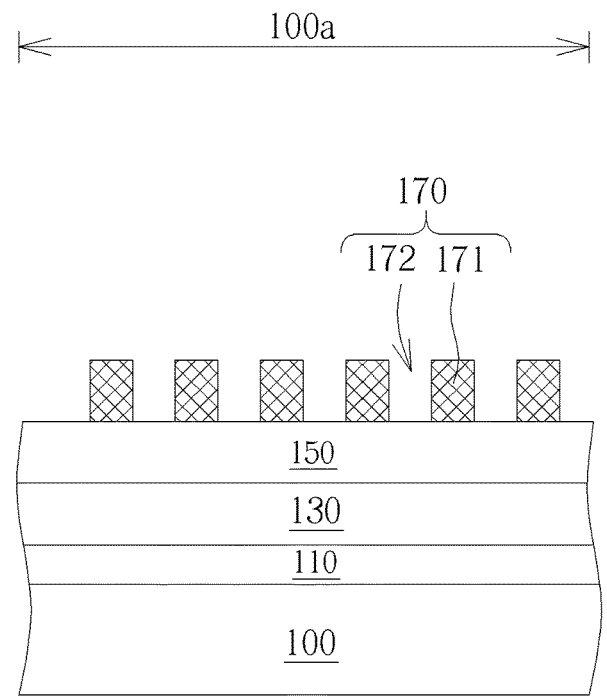
Figure 5:
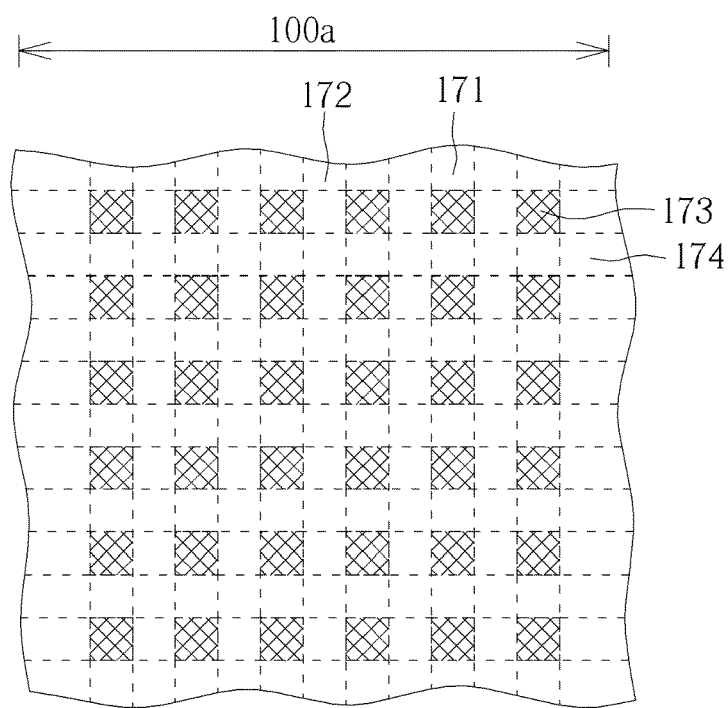
Figure 6:
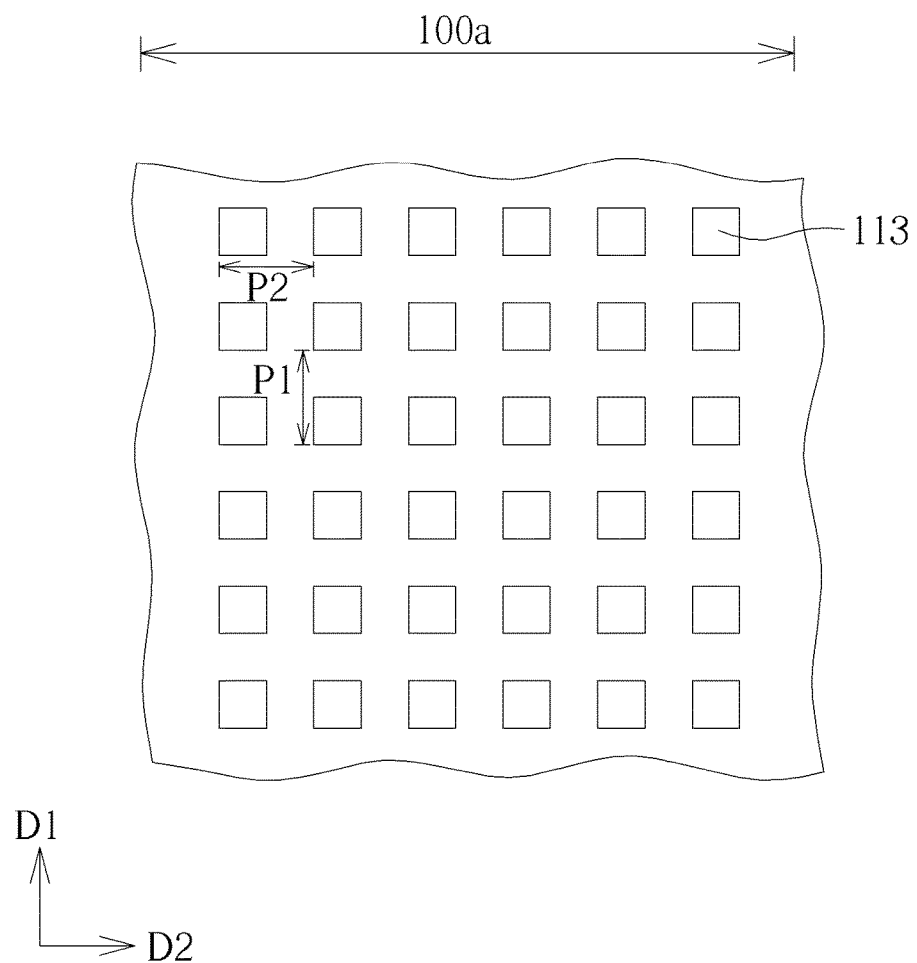

Please refer to FIG. 1 to FIG. 6, which are schematic diagrams illustrating a forming process of a semiconductor device according to the first embodiment of the present invention, wherein FIG. 1 shows the photomask used in the method; FIGS. 2, 5 and 6 respectively show a semiconductor device during the forming process, and FIGS. 3 and 4 respectively shows a cross-sectional view along the cross line A-A' in FIG. 2.

First of all, a substrate layer 100 is provided, and the substrate layer 100 for example includes a semiconductor substrate (not shown in the drawings) like a silicon substrate, a silicon containing substrate or a silicon-on-insulator (SOI) substrate. The substrate layer 100 has a first region 100a such as a core region like a cell region defined thereon, and other region surrounding the first region 100a is defined as a second region (not shown in the drawings) such as a periphery region. In one embodiment, a material layer 110, a hard mask layer 130 for example including silicon nitride (SiN), a mask layer 150 for example including silicon (Si) and a mask layer 170 forming including silicon oxynitride (SiON) stacked one over another on the substrate 100 are sequentially formed, to cover the first region 100a of the substrate 100 as shown in FIGS. 2-3. The material layer 110 includes a target layer which is patterned through the forming method, and which may include any suitable material such as being a conductive layer including tungsten (W), copper (Cu) or aluminum (Al) or being a dielectric layer including silicon oxide (SiO) or silicon nitride, but is not limited thereto.

Next, the photomask 401, 403 as shown in FIG. 1 is sequentially used to forma corresponding photoresist structure on the first region 100a of the substrate 100, to pattern the stacked layers (such as the mask layers 170, 150 and the hard mask layer 130) underneath. For example, the photomask 401 defines a plurality of photomask patterns 401a extended along a direction D1, so that a photoresist structure 190 including a sacrificial layer 195, an anti-reflective layer 193 and a patterned photoresist 191 stacked one over another on the mask layer 170 is formed through the photomask 401, with the patterned photoresist 191 including a plurality of mandrel patterns 191a in correspond with the photomask patterns 401a. The mandrel patterns 191a is used to perform a sidewall image transfer (SIT) technique including a deposition process and an etching process, so as to form a spacer (not shown in the drawings) at two sidewalls of each mandrel pattern 190a, with the forming position thereof being shown as dashed-line frames 401b shown on photomask 401. Then, the patterned photoresist 191 is completely removed and the spacers are used to perform a patterning process, to form a plurality of mask patterns 171 extended along the direction D1 in the mask layer. Please note that, each of the mask patters 171 is separated from each other by a plurality of trenches 172 extended along the direction D1, as shown in FIG. 4.

On the other hands, the photomask 403 defines a plurality of photomask patterns 403a extended along another direction D2 which is perpendicular to the direction D1, so that another photoresist structure (not shown in the drawings) also including a sacrificial layer (not shown in the drawings), an anti-reflective layer (not shown in the drawings) and a patterned photoresist (not shown in the drawings) stacked one over another on the mask layer 170 is formed through the photomask 403, with the patterned photoresist including a plurality of mandrel patterns (not shown in the drawings) in correspond with the photomask patterns 403a. The mandrel patterns (not shown in the drawings) are also used to perform another SIT technique including a deposition process and an etching process, so as to form a spacer (not shown in the drawings) at two sidewalls of each mandrel pattern, with the forming position thereof being shown as dashed-line frames 403b shown on photomask 403. Then, the patterned photoresist is completely removed and the spacers are used to perform another patterning process, to forma plurality of trenches 174 extended along the direction D2 to further pattern the mask layer 170 into a plurality rectangular mask patterns 173 in an array arrangement as shown in FIG. 5. It is noted that, although the aforementioned steps are exemplified by performing the SIT technique, the double patterning and double etching (2P2E) process on the mask layer 170 to form the corresponding patterns and the trenches, the practical process is not limited thereto and may be further modify according to product requirements. For example, the photomask 403 may be used before the photomask 401, or a double patterning and one etching process (2P1E) may be optionally performed.

Next, the mask patterns 173 is sequentially transferred into the mask layer 150, the hard mask layer 130 and the material layer 110, so as to form a plurality of patterns 113 on the mask layer 110 in accordance with the mask patterns 173, as shown in FIG. 6. Precisely speaking, the patterns 113 are arranged also in an array arrangement, so that, each of the patterns 113 is separately and regularly arranged to obtain a same pitch P1 along the direction D1, for example being about 75 nm to 80 nm, and to obtain a same pitch P2 along the direction D2, for example being about 78 nm to 85 nm, but is not limited thereto.

According to the above processes, the method of the first preferred embodiment is completed. In the present embodiment, the photomasks 401, 403 as shown in FIG. 1 are sequentially used to form a plurality of trenches 172, 174 extending along the directions D1, D2 respectively, and then, the mask layer 170 is patterned to form a plurality of mask patterns 173 in an array arrangement followed by further transferring the mask patterns 173 to the material layer 110 underneath to form the patterns 113. Please note that, the photomask patterns 401a defined by the photomask 401 and the photomask patterns 403a defined by the photomask 403 are respectively extended along two different directions D1, D2 which are perpendicular to each other. That is, the subsequent formed patterns 113 is allowable to be formed in accordance with the overlapping region between the photomask patterns 401a, 403a. Accordingly, through the photomask 401, 403, two SIT techniques and a 2P2E process is carried out to form a structure with a smaller, more densely packed layout under a simplified and cost-reduced process flow.

People skilled in the arts may fully understand that the method of the present invention is not limited to be achieved through the aforementioned process, and also include other process. For example, in some embodiments, the hard mask layer 130 may be omitted for directly patterning the material layer 110 underneath or the photomask may include other patterns based on the product requirements. The following description will detail the different embodiments of the method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 7:
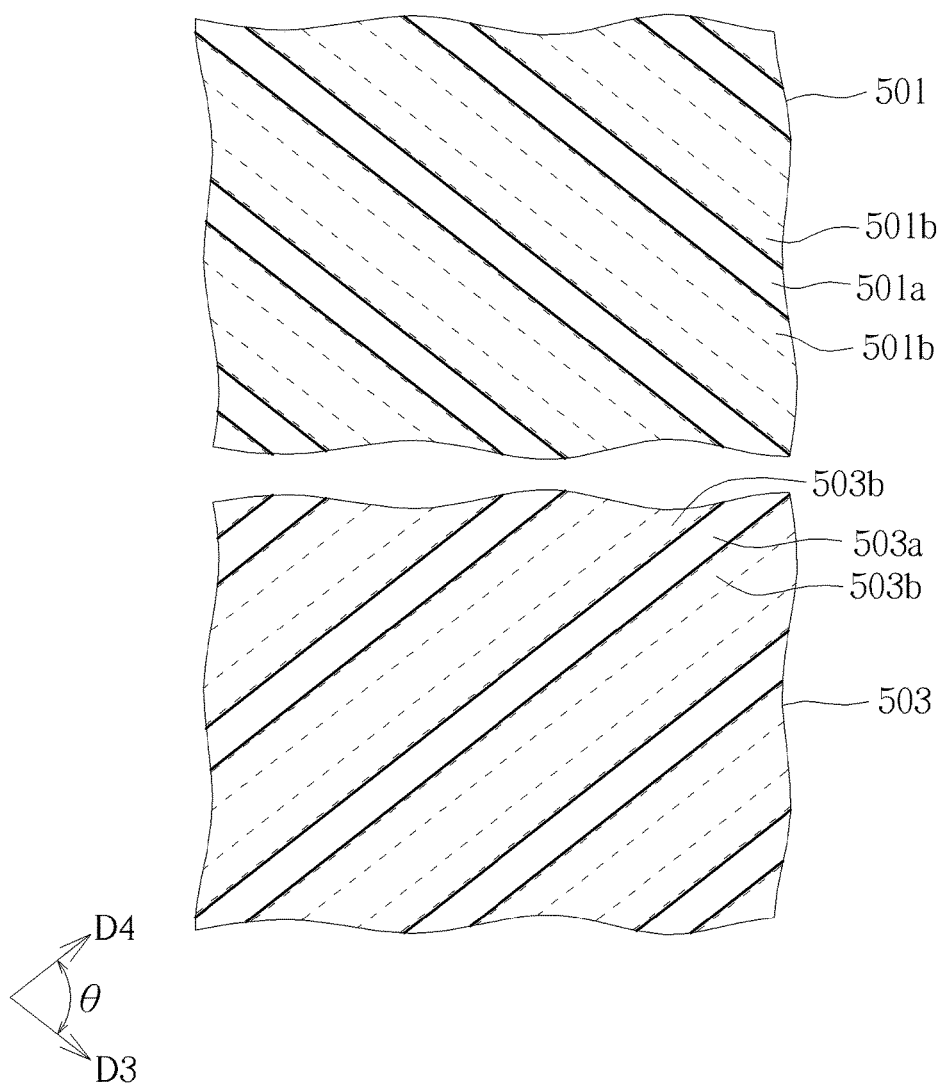
Figure 8:
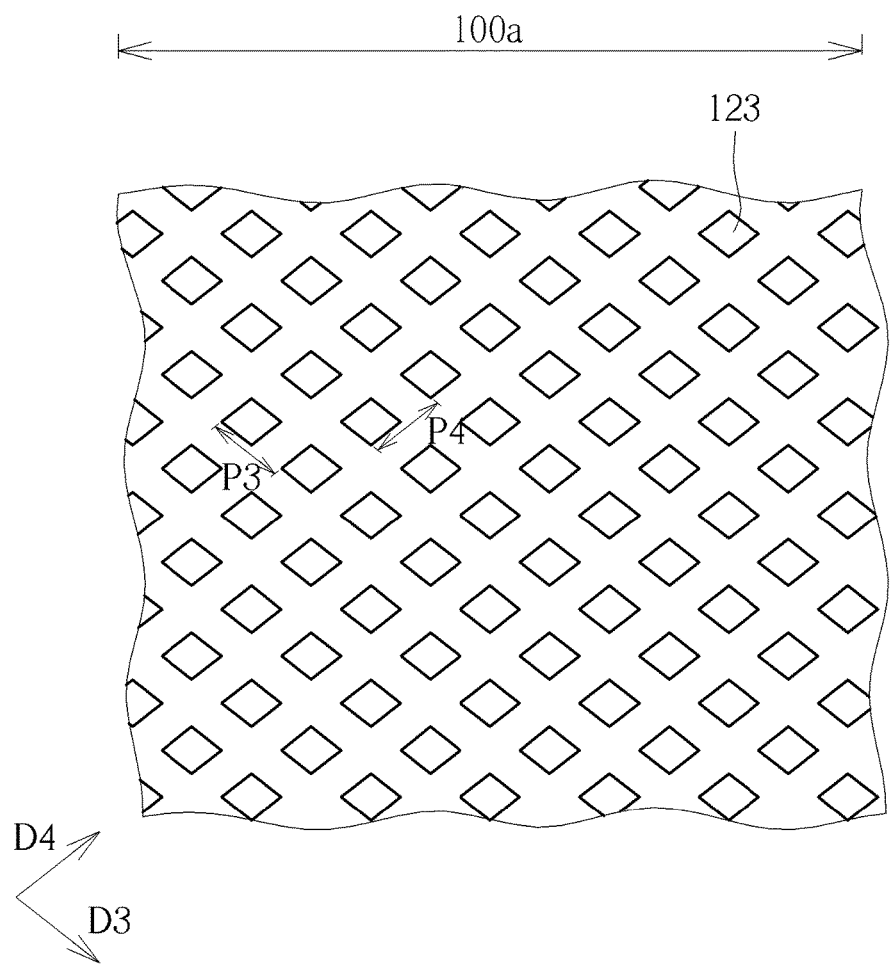

Please refer to FIGS. 7 and 8, which are schematic diagrams illustrating a forming process of a semiconductor device according to the second embodiment of the present invention, wherein FIG. 7 shows the photomask used in the method and FIG. 8 shows a top view of a semiconductor device during the forming process. The formal steps in the present embodiment are similar to those in the first embodiment, and which will not redundantly described herein. The differences between the present embodiment and the aforementioned first embodiment are that, the forming method of the present embodiment is accomplished by using photomask 501, 503, a SIT technique and a 2P2E process to form corresponding mandrel patterns (not shown in the drawings) to pattern the stacked layer (such as the mask layers 170, 150 and the hard mask layer 130) underneath.

Precisely speaking, the photomask 501 defines a plurality of photomask patterns 501a extended along a direction D3 which is different from the directions D1, D2, and the photomask 503 defines a plurality of photomask patterns 503a extended along a direction D4 which is different from the directions D1, D2 and D3, with the direction D3 preferably not perpendicular with the direction D4 and a cross angle therebetween being ranged from 40 degrees to 60 degrees, but not limited thereto. Then, through the photomask 501, a photoresist structure (not shown in the drawings) including a sacrificial layer (not shown in the drawings), an anti-reflective layer (not shown in the drawings) and a patterned photoresist (not shown in the drawings) stacked one over another on the mask layer 170 is formed, with the patterned photoresist including a plurality of mandrel patterns (not shown in the drawings) in correspond with the photomask patterns 501a. The mandrel patterns are used to perform a SIT technique including a deposition process and an etching process, so as to form a spacer (not shown in the drawings) at two sidewalls of each mandrel pattern, with the forming position thereof being shown as dashed-line frames 501b shown on photomask 501. Then, the patterned photoresist is completely removed and the spacers are used to perform a patterning process, to form a plurality of mask patterns (not shown in the drawings) and trenches (not shown in the drawings) extended along the direction D3 in the mask layer 170.

Also, through the photomask 503, a photoresist structure (not shown in the drawings) including a sacrificial layer (not shown in the drawings), an anti-reflective layer (not shown in the drawings) and a patterned photoresist (not shown in the drawings) stacked one over another on the mask layer 170 is formed, with the patterned photoresist including a plurality of mandrel patterns (not shown in the drawings) in correspond with the photomask patterns 503a. The mandrel patterns are used to perform another SIT technique including a deposition process and an etching process, so as to form a spacer (not shown in the drawings) at two sidewalls of each mandrel pattern, with the forming position thereof being shown as dashed-line frames 503b shown on photomask 503. Then, the patterned photoresist is completely removed and the spacers are used to perform another patterning process, to form a plurality of trenches (not shown in the drawings) extended along the direction D4 in the mask layer 170 to further pattern the mask layer 170 into a plurality of mask patterns (not shown in the drawings).

Following these, the mask patterns are sequentially transferred into the mask layer 150, the hard mask layer 130 and the material layer 110 underneath, to form a plurality of patterns 123 in the mask layer 110 in accordance with the aforementioned mask patterns 173, as shown in FIG. 8. The patterns 123 are arranged also in an array arrangement, so that, each of the patterns 123 is separately and regularly arranged to obtain a same pitch P3 along the direction D3, for example being about 65 nm to 70 nm, and to obtain a same pitch P4 along the direction D4, for example being about 65 nm to 70 nm, but is not limited thereto.

According to the above processes, the method of the second preferred embodiment is completed. It is noted that although the mask patterns of the present embodiment are also regular arranged in an array arrangement, the mask patterns are formed in accordance with plural dashed-line frames which are across and not perpendicular with each other. That is, each of those mask patterns may therefore obtain a diamond-shape, and the patterns 123 formed accordingly may also obtain a diamond-shape. Under such arrangement, through the photomask 501, 503, two SIT techniques and a 2P2E process may also be carried out to form a structure with further smaller, more densely packed layout under a simplified and cost-reduced process flow.

However, among the patterns 123 of the present embodiment, some of them located at the boundary of the first area 100a are easy to be limited by its shape and the range of the first area 100a, to perform an incomplete profile thereby. In this situation, the practical function and the application of those patterns 123 located at the boundary of the first area 100a may also be affected, further damaging to the entire performance of the semiconductor device.

Figure 9:
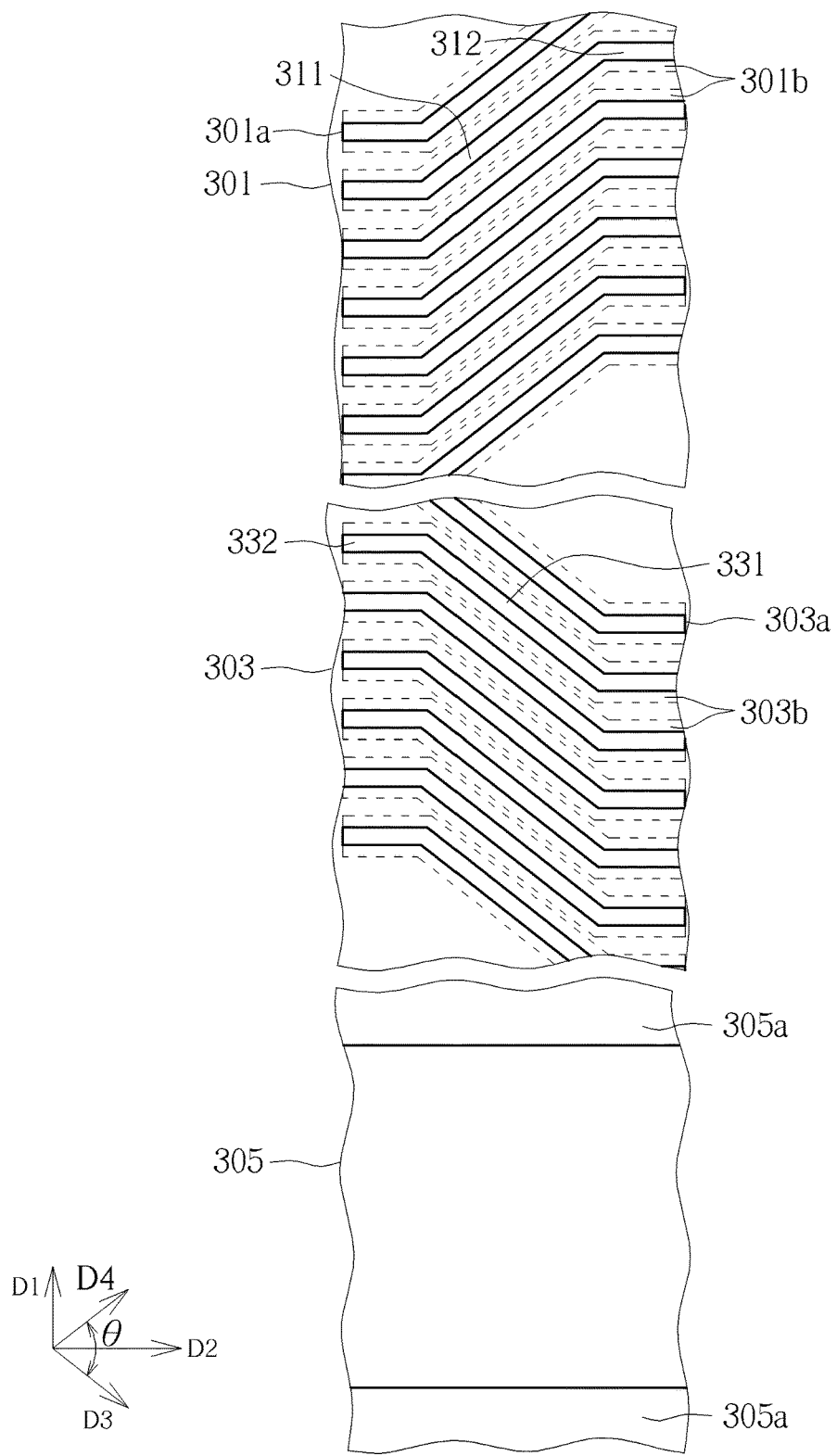
Figure 10:
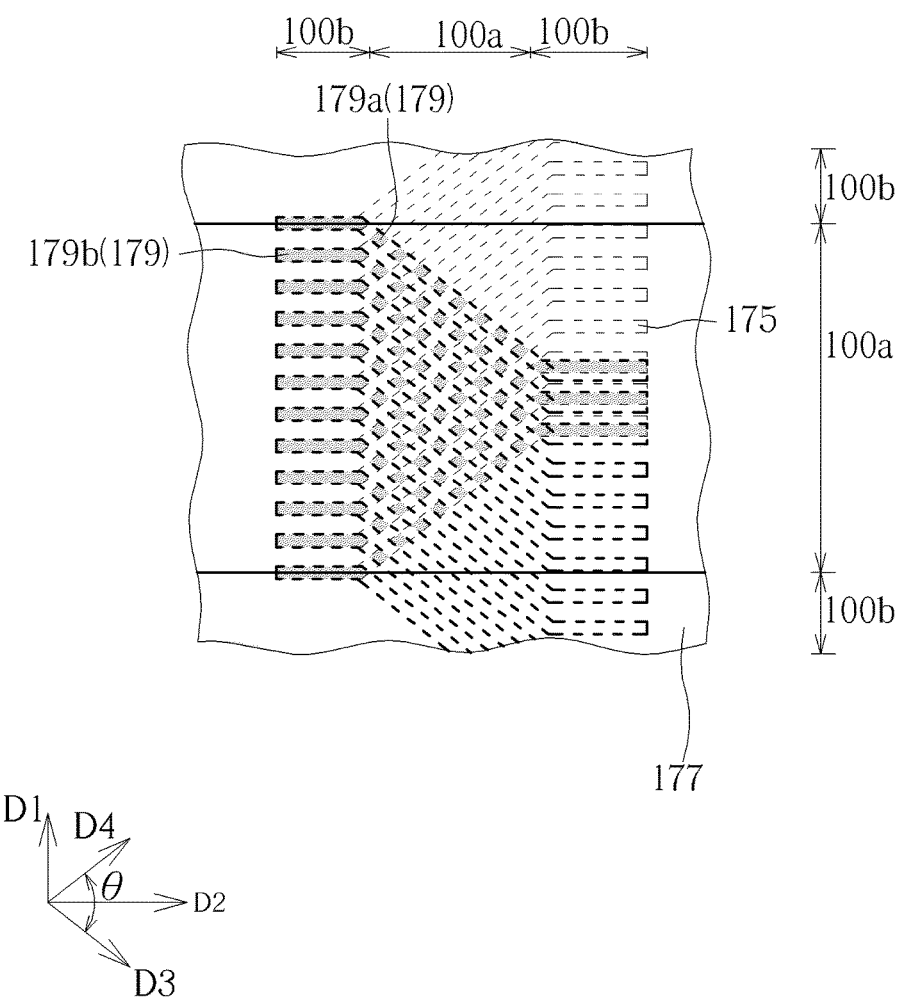
Figure 11:
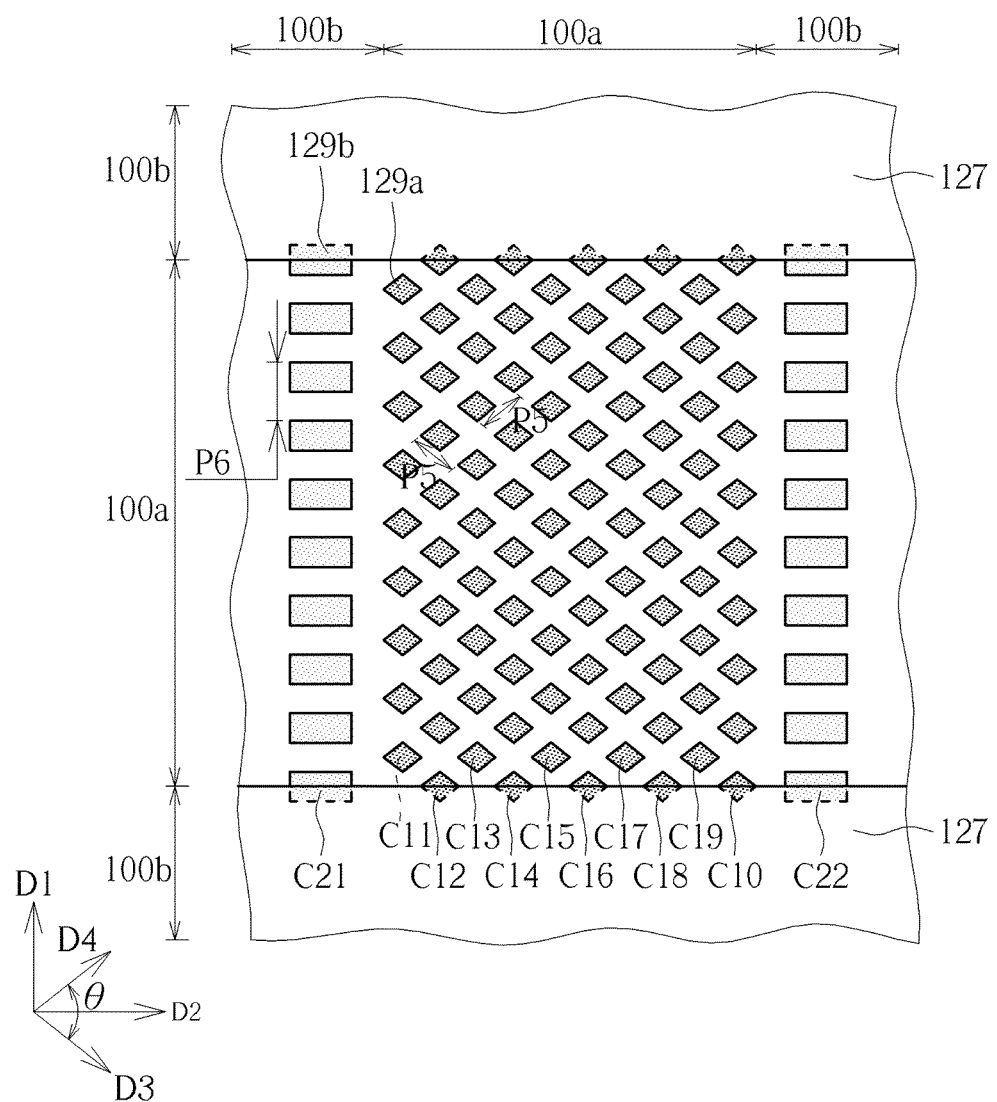

Please refer to FIGS. 9-11, which are schematic diagrams illustrating a forming process of a semiconductor device according to the third embodiment of the present invention, wherein FIG. 9 shows the photomask used in the method and FIGS. 10 and 11 respectively show a top view of a semiconductor device during the forming process. The formal steps in the present embodiment are similar to those in the first embodiment, and which will not redundantly described herein. The differences between the present embodiment and the aforementioned first embodiment are that, the forming method of the present embodiment is accomplished by using photomask 301, 303, 305 to respectively form corresponding mandrel patterns (not shown in the drawings) in the first region 100a and a second region 100b of the substrate 100 as shown in FIG. 10, to pattern the stacked layer (such as the mask layers 170, 150 and the hard mask layer 130) underneath.

Precisely speaking, the photomask 301 defines a plurality of photomask patterns 301a parallel extended from each other, and each of the photomask patterns 301a includes an entity portion 311 extending along the direction D4 and an entity portion 312 extending along the direction D2. The angle between the directions D3, D4 is about 40 degree to 60 degree. The entity portions 311 are disposed within the first region 100a, and the entity portions 312 are disposed adjacent to two ends of each of the entity portions 311, within the second region 100b, as shown in FIG. 9. On the other hands, the photomask 303 defines a plurality of photomask patterns 303a parallel extended from each other, and each of the photomask patterns 303a includes an entity portion 3311 extending along the direction D3 and an entity portion 332 extending along the direction D2. The entity portions 331 are disposed within the first region 100a, and the entity portions 332 are disposed adjacent to two ends of each of the entity portions 331, within the second region 100b, as shown in FIG. 9. Then, the photomask 305 defines two photomask patterns 305a which are parallel disposed from each other, as shown in FIG. 9.

Next, a photoresist structure (not shown in the drawings) also including a sacrificial layer (not shown in the drawings), an anti-reflective layer (not shown in the drawings) and a patterned photoresist (not shown in the drawings) stacked one over another on the mask layer 170 is formed through the photomask 301, with the patterned photoresist including a plurality of mandrel patterns (not shown in the drawings) in correspond with the photomask patterns 301a. The mandrel patterns (not shown in the drawings) are then used to perform a SIT technique including a deposition process and an etching process, so as to form a spacer (not shown in the drawings) at two sidewalls of each mandrel pattern, with the forming position thereof being shown as dashed-line frames 301b shown on photomask 301. Then, the patterned photoresist is completely removed and the spacers are used to perform a patterning process, to form a plurality of mask patterns 175 and trenches 176 paralleled from each other, as shown in FIG. 10

After that, another photoresist structure (not shown in the drawings) also including a sacrificial layer (not shown in the drawings), an anti-reflective layer (not shown in the drawings) and a patterned photoresist (not shown in the drawings) stacked one over another on the mask layer 170 is formed through the photomask 303, with the patterned photoresist including a plurality of mandrel patterns (not shown in the drawings) in correspond with the photomask patterns 303a. The mandrel patterns (not shown in the drawings) are also used to perform another SIT technique including a deposition process and an etching process, so as to form a spacer (not shown in the drawings) at two sidewalls of each mandrel pattern, with the forming position thereof being shown as dashed-line frames 303b shown on photomask 303. Then, the patterned photoresist is completely removed and the spacers are used to perform another patterning process, to further pattern the mask patterns 175 of the mask layer 170 into a plurality mask patterns 179 as shown in FIG. 10. Each of the mask patterns 179 are formed in accordance with plural dashed-line frames 301b, 303b which are across but not perpendicular with each other, with each mask pattern 179b being formed in accordance with an overlapping portion between each dashed-line frame 301b, 303b extending along the direction D2 to obtain a relative greater size and a rectangular shape, and with each mask pattern 179a being formed in accordance with an overlapping portion between each dashed-line frame 301b, 303b extending along the directions D3, D4 to obtain a relative smaller size and a diamond shape, as shown in FIG. 10. Thus, through the aforementioned arrangement, it is sufficient to avoid the patterns with incomplete profile being formed at the boundary of the first region 100a. On the other hands, other positions that may forms patterns with incomplete profile are blocked by mask patterns 177 which are formed in accordance with the photomask patterns 305a. The mask patterns 177 have a relative greater size than that of the mask patterns 179a, 179b.

Following these, the mask patterns 177, 179 are sequentially transferred into the mask layer 150, the hard mask layer 130 and the material layer 110 underneath, to form a plurality of patterns 127, 129a, 129b in the mask layer 110 in accordance with the mask patterns 177, 179, as shown in FIG. 11. Precisely, the patterns 129a are corresponding to the mask patterns 179a, to be arranged in an array arrangement, so that, each of the patterns 129a is separately and regularly arranged to obtain a same pitch P5 along the directions D3, D4 for example being about 65 nm to 70 nm, but is not limited thereto. As shown in FIG. 11, the patterns 129a are regularly arranged along the direction D1 to form a plurality of first columns C11, C12, C13, C14, C15, C16, C17, C18, C19, C10, with the patterns 129a in each first column C11, C12, C13, C14, C15, C16, C17, C18, C19, C10 being alternately arrangement along the direction D2. For example, the patterns 129a arranged in two adjacent columns such as C11, C12 are alternately arranged from each other, for example within a misalignment of about ½ pitch P5 along the direction D1 as shown in FIG. 11, but not limited thereto.

On the other hands, the patterns 129b are formed according to the mask patterns 179b, and each of the patterns 129b is separately and regularly arranged along the direction D1, at two opposite sides of the patterns 129a, to form two second columns C21, C22. That is, the patterns 129b may obtain a same pitch P6 along the direction D1, for example being about 75 nm to 80 nm, but is not limited thereto. As shown in FIG. 11, the patterns 179b disposed in the two second columns C21, C22 are in alignment with each other, and which are alternately arrangement with the patterns 179a disposed in adjacent first columns C11, C10, for example within a misalignment of about ½ pitch P6 along the direction D1, but not limited thereto. The patterns 127 are formed according to the mask patterns 177, and which are disposed along the direction D2, at another two opposite sides of the patterns 129a. It is noted that, since the photomask patterns 305a of the photomask 305 partially overlap the photomask patterns 301a, 303a of the photomasks 301, 303, while transferring the mask patterns corresponding thereto into the material layer 110, the patterns 127 formed accordingly may therefore merge with each of a part of the patterns 129a and each of a part of the patterns 129b. For example, the patterns 127 disposed at a side (such as a top side) of the patterns 129a merges one pattern 129b within the second column C21 and one pattern 129b within the second column C22, and further merges one pattern 129a within each even column C12, C14, C16, C18, C10 of the first columns C10-C19 respectively, as shown in FIG. 11. However, people well skilled in the art should easy realize the pattern 127 is not limited to merge with the patterns 129a, 129b in the aforementioned example, and the merge relation thereof may be modified according to practical product requirements. In another embodiment (not shown in the drawings), each of the patterns 127 may also merge one pattern 129b of each second column C21, C22 respectively, and further merge one pattern 129a within each odd column C11, C13, C15, C17, C19 of the first columns C10-C19 respectively.

According to the above processes, the method of the third preferred embodiment is completed. It is noted that although the mask patterns 179a, 179b and patterns 129a, 129b of the present embodiment are also regularly arranged in an array arrangement, the mask patterns 179a, 179b are formed in accordance with plural dashed-line frames 301b, 303b which are across and not perpendicular with each other and include different portion extending along different directions D2, D3, D4. That is, the mask patterns 179a, 179b and the patterns 129a, 129b may therefore obtain different shapes and different sizes at the same time. Under such arrangement, through the photomasks 301, 303, 305, two SIT techniques and a 2P2E process may also be carried out to form a structure with further smaller, more densely packed layout under a simplified and cost-reduced process flow. Furthermore, in the method of the present embodiment, portions at two sides of each dashed-line frames 301b, 303b are designed to be overlapped with each other for forming the mask patterns 179b and the patterns 129b within the second region 100b according in the subsequent process, so that, it is sufficient to avoid the patterns with incomplete profile being formed at two opposite sides (for example the right side and the left side) of the first region 100a. On the other hands, the mask patterns 179a or patterns 129a disposed adjacent to another two opposite sides (for example the top side and the bottom side) of the first region 100a are blocked by the mask patterns 177 and the patterns 127 which are formed according to the photomask patterns 305a, so as to avoid the pattern with incomplete profile being formed at the another two opposite sides. Thus, the method of the present embodiment may further facilitate the processes of forming the a structure with smaller, condensed layout, and also, the method of the present embodiment may form patterns with a particular greater size, pitch and/or shape within a particular region according to the product requirement.

Figure 12:
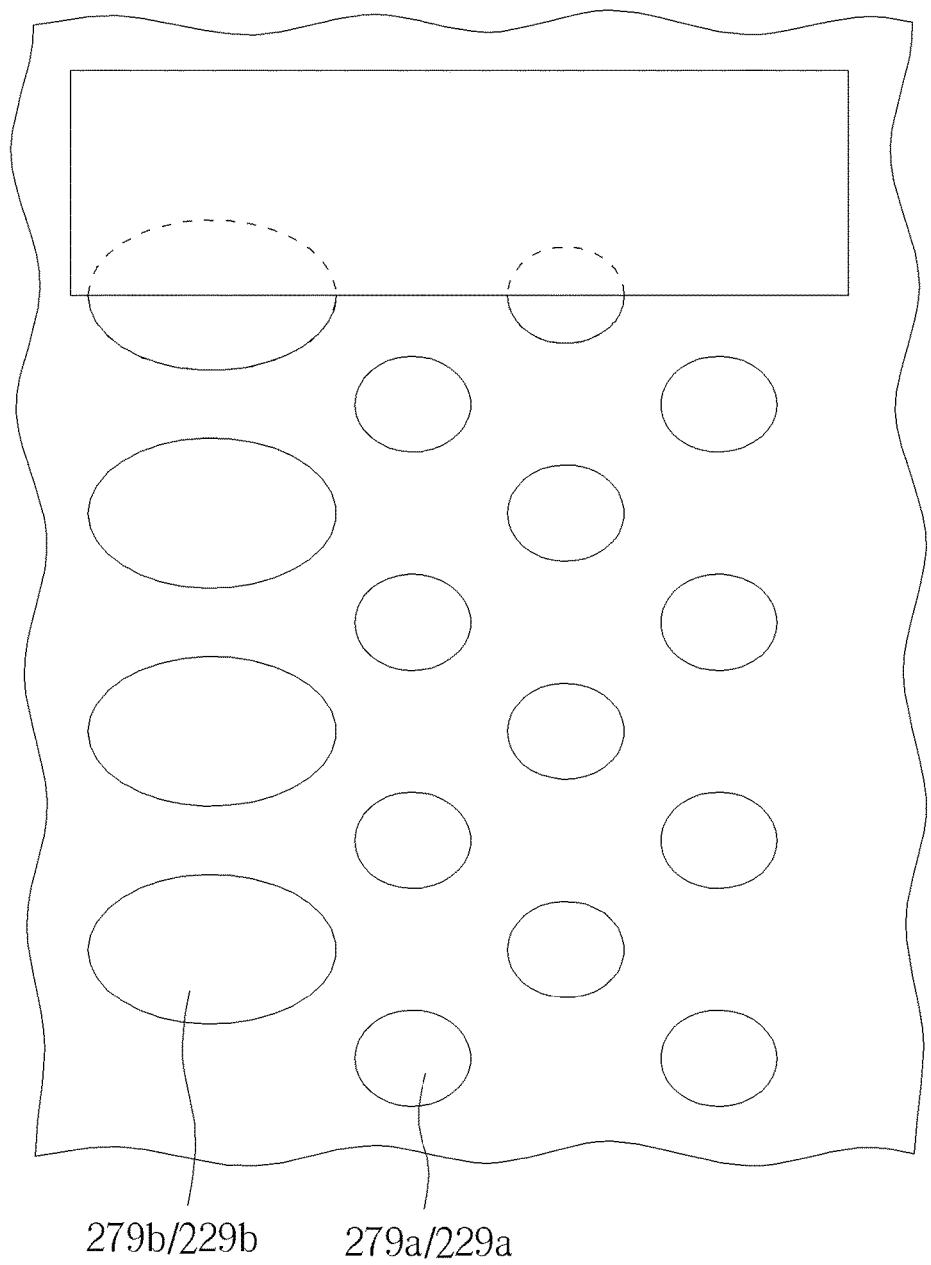
FIG. 12 shows another example of a semiconductor device after forming patterns in the third embodiment.

Moreover, it is also noted that, although the mask patterns 179a and the patterns 129a are all exemplified to be formed in a diamond shape, the practical shapes thereof are not limited thereto and which may be adjusted by modifying the conditions of the exposure process, the development process, the etching process and other processes that have been performed. Accordingly, the shape of each of the mask patterns 179a and the patterns 129a may therefore be rounding to present a round shape or an oval shape, such as patterns 279a/229a as shown in FIG. 12.

Figure 13:
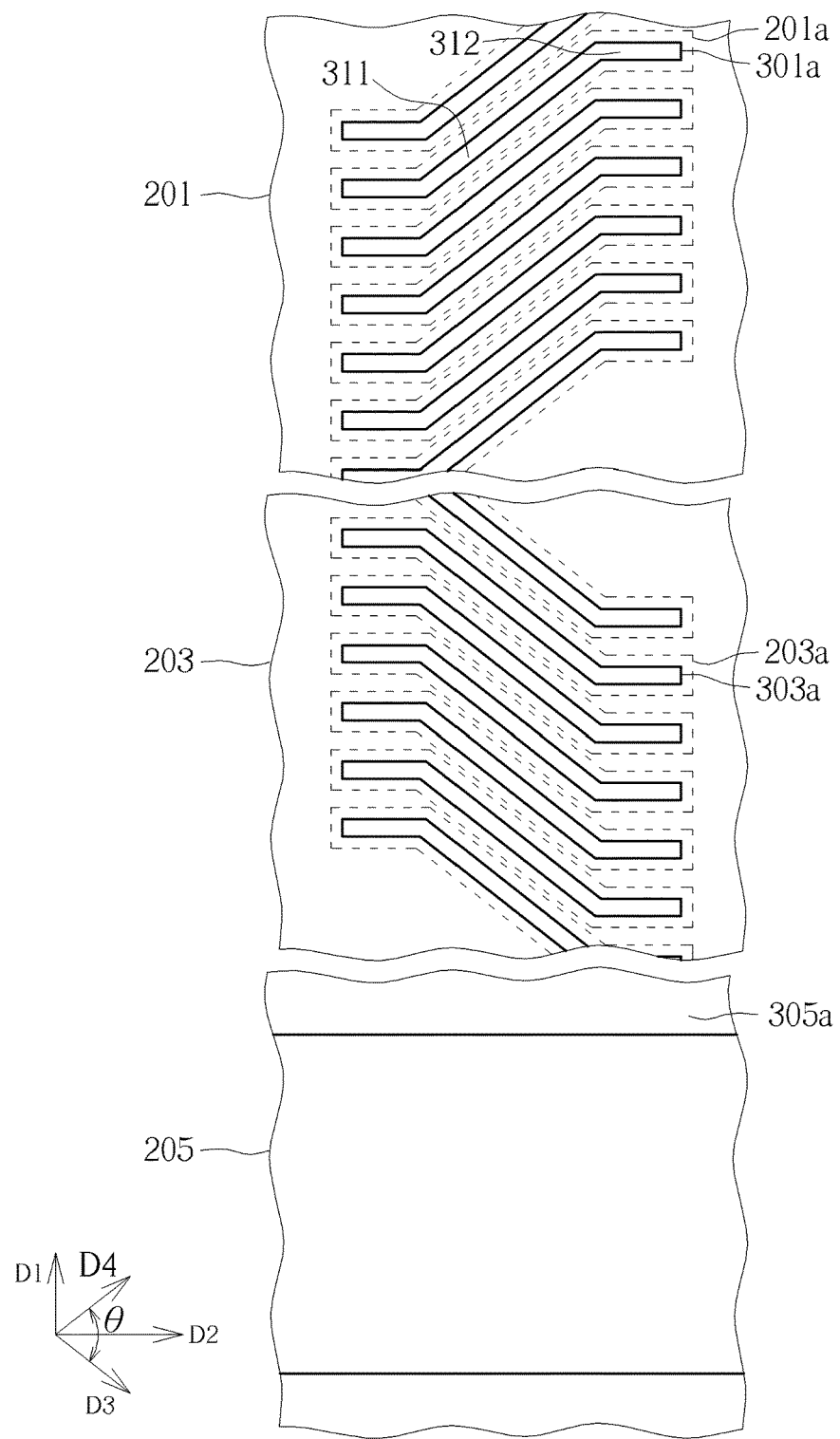
Figure 14:
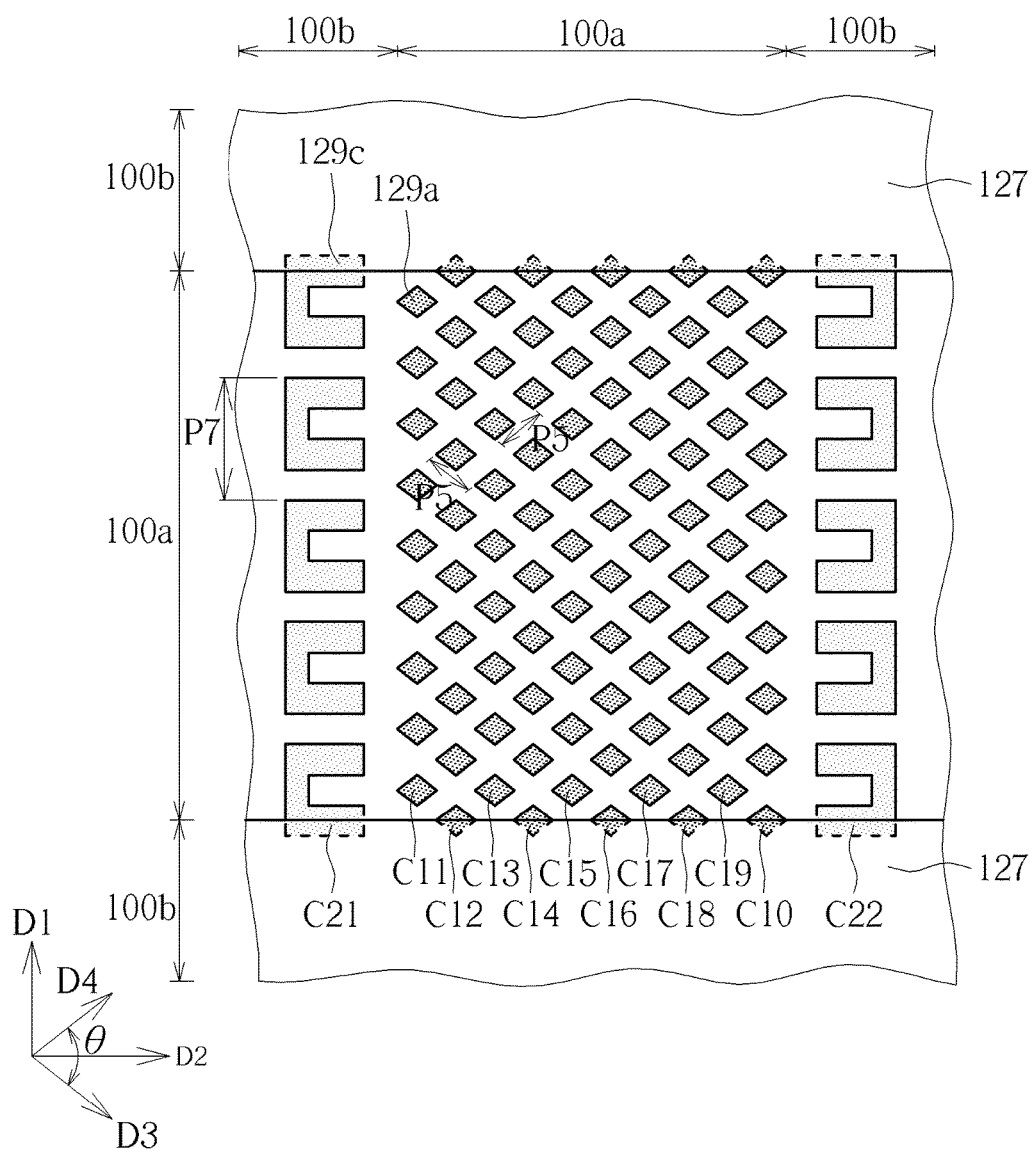

Please refer to FIGS. 13-14, which are schematic diagrams illustrating a forming process of a semiconductor device according to the fourth embodiment of the present invention, wherein FIG. 13 shows the photomask used in the method and FIG. 14 shows a top view of a semiconductor device during the forming process. The formal steps in the present embodiment are similar to those in the third embodiment, and which will not redundantly described herein. The differences between the present embodiment and the aforementioned third embodiment are that, an additional space is retained at two sides of each photomask 201, 203, 205 of the present embodiment with respect to each photomask 301, 303, 305 in the aforementioned embodiment as shown in FIG. 13, and the forming method of the present embodiment is accomplished by using the photomask 201, 203, 205 to respectively form corresponding mandrel patterns (not shown in the drawings) in the first region 100a and a second region 100b of the substrate 100, to pattern the stacked layer (such as the mask layers 170, 150 and the hard mask layer 130) underneath.

Precisely speaking, the photomask 201 also defines a plurality of photomask patterns 301a parallel extended from each other, the photomask 203 also defines a plurality of photomask patterns 303a parallel extended from each other, and the photomask 305 also defines two photomask patterns 305a which are parallel disposed from each other. Next, corresponding photoresist structures (not shown in the drawings) each also including a sacrificial layer (not shown in the drawings), an anti-reflective layer (not shown in the drawings) and a patterned photoresist (not shown in the drawings) stacked one over another on the mask layer 170 are respectively formed through the photomasks 201, 203, with each of the patterned photoresist including a plurality of mandrel patterns (not shown in the drawings) in correspond with the photomask patterns 301a 303a respectively. The mandrel patterns (not shown in the drawings) are then used respectively to perform a SIT technique including a deposition process and an etching process, so as to forma spacer (not shown in the drawings) at two sidewalls of each mandrel pattern, with the forming position thereof being shown as dashed-line frames 201a, 203a shown on photomask 201, 203. Then, the patterned photoresist is completely removed and the spacers are used to perform a patterning process, to form a plurality of mask patterns (not shown in the drawings) in the mask layer 170 according to the overlapped region (not shown in the drawings) between the dashed-line frames 201a, 203a. After that, the mask patterns are sequentially transferred into the mask layer 150, the hard mask layer 130 and the material layer 110 underneath, to form a plurality of patterns 127, 129a, 129c in the mask layer 110, as shown in FIG. 14.

It is noted that, through the two SIT processes of the present embodiment, the spacers with complete frame are transferred into each stacked layer (like the mask layers 170, 150) underneath without firstly removing the connection portions of the spacers. In other words, in the SIT processes of the aforementioned embodiments (including the first, the second and the third embodiment), an cutting process is additionally performed on each of the spacers formed in those aforementioned embodiments, to form two separate spacers (not shown in the drawings) in according with each dashed-line frame 301b, 303b, 401b, 403b, 501b, 503b at two sides of each photomask pattern 301a, 303a, 401a, 403a, 501a, 503a. The cutting process in the SIT processes of the present embodiment is omitted, so that, the spacers formed in the present embodiment may retain its original frame surrounding the entire photomask patterns 301a, 303a, like the dashed-line frame 201a, 203a as shown in FIG. 13.

Under such arrangement, the patterns 129c may therefore be formed in the material layer 110 according to the overlapped portions at two sides of each dashed-line frame 201a, 203a, to obtain a greater size and a U-shape, the patterns 129a are also formed in the material layer 110 according to the overlapped portions between each dashed-line frame 201a, 203a extending along the directions D3, D4 to obtain a relative smaller size and a diamond shape, as shown in FIG. 14. Each of the patterns 129c is separately and regularly arranged along the direction D1 at two opposite sides of the patterns 129a, to form two second columns C21, C22. That is, the patterns 129c may obtain a same pitch P7 along the direction D1, for example being about 150 nm to 160 nm, but is not limited thereto. As shown in FIG. 14, the patterns 179c disposed in the two second columns C21, C22 are in alignment with each other, and which are alternately arrangement with the patterns 179a disposed in adjacent first columns C11, C10. The patterns 127 are also formed according to the photomask patterns 305a, and which are disposed along the direction D2, at another two opposite sides of the patterns 129a. In this way, each of the patterns 127 may merge with each of a part of the patterns 129a and each of a part of the patterns 129c.

According to the above processes, the method of the fourth preferred embodiment is completed. It is noted that although the patterns 129a, 129c of the present embodiment are also regularly arranged in an array arrangement, the patterns 129c are formed to obtain a relative greater size, pitch P7 and a special shape than that of the aforementioned third embodiment, due to different conditions of the SIT process of the present embodiment. Thus, the method of the present embodiment may also facilitate the processes of forming the a structure with smaller, condensed layout, and also, the method of the present embodiment may further form patterns with a particular greater size, pitch and/or a particular shape within a particular region according to the product requirement.

Figure 15:
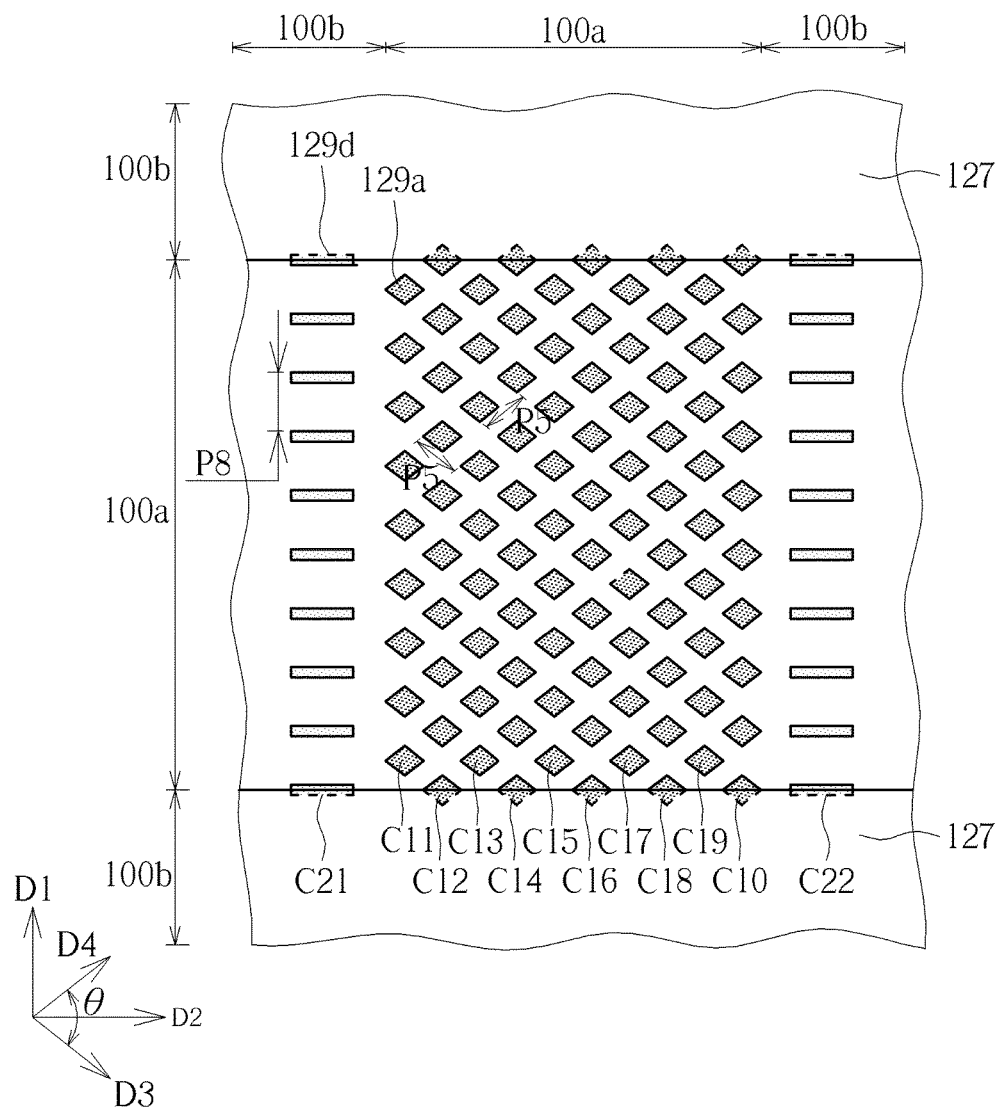
FIG. 15 is a schematic diagram illustrating a method of forming a semiconductor device according to a fifth embodiment of the present invention.

Please refer to FIG. 15, which is a schematic diagram illustrating a forming process of a semiconductor device according to the fifth embodiment of the present invention, wherein FIG. 15 shows a top view of a semiconductor device during the forming process. The formal steps in the present embodiment are similar to those in the third embodiment, and which will not redundantly described herein. The differences between the present embodiment and the aforementioned third embodiment are that, the relative positions of the photomask patterns 301a, 303a on the photomask 301, 303 are further adjusted, to let the entity portion extending along the direction D2 of each of the photomask patterns 301a defined on the photomask 301 only be partially overlapped with the entity portion extending along the direction D2 of each of the photomask patterns 303a defined on the photomask 303, instead of being completely overlapped with each other. Through this arrangement, each spacer (not shown in the drawings) formed in accordance with the entity portion extending along the direction D2, via the SIT process may also be partially overlapped with each other, instead of being completely overlapped with each other.

Thus, patterns 129d with a relative smaller size and a rectangular shape may therefore be formed in the material layer 110 due to the method of the present embodiment, as shown in FIG. 15. Each of the patterns 129d is also separately and regularly arranged along the direction D1 at two opposite sides of the patterns 129a, to form two second columns C21, C22, so that, the patterns 129d may obtain a same pitch P8 along the direction D1, for example being about 65 nm to 70 nm, but is not limited thereto. As shown in FIG. 15, the patterns 179d disposed in the two second columns C21, C22 are in alignment with each other, and which are alternately arrangement with the patterns 179a disposed in adjacent first columns C11, C10.

According to the above processes, the method of the fifth preferred embodiment is completed. It is noted that although the patterns 129a, 129d of the present embodiment are also regularly arranged in an array arrangement, the patterns 129d are formed to obtain a relative smaller size and pitch P8 than that of the aforementioned third embodiment, due to changing the relative portion of each photomask pattern. That is, the patterns 129d formed in the present embodiment may include a relative smaller size along the direction D1, in comparison with that of the patterns 129b of the aforementioned third embodiment. However, in another embodiment, formed patterns (not shown in the drawings) may also have a relative smaller size along the direction D2 than the patterns 129b, by changing the relative positions between the photomask patterns. Thus, the method of the present embodiment may also facilitate the processes of forming the a structure with smaller, condensed layout, and also, the method of the present embodiment may further form patterns with a particular size, pitch and/or a particular shape within a particular region according to the product requirement.

Overall speaking, the present invention utilizes a multiple patterning process such as a SIT process and a double patterning process, to form photomask patterns which are crossed with each other, and to form corresponding patterns in a target layer through these crossed portions of the photomask patterns. In this way, through further adjusting the shape, the crossed relation and the extending direction of each photomask patterns, it is sufficient to form an ideal finer structure with smaller and compact layout via the SIT process and the double patterning process, under a simplified and cost-reduced process flow. Thus, the method of the present invention may be practical applied on a semiconductor process, for example a process of a semiconductor memory device like a dynamic random access memory (DRAM) device, to form the pads electrically connected to each storage node contact (SNC). For example, in one embodiment, before performing the aforementioned processes, a plurality of buried gates (not shown in the drawings) is previously formed within the substrate 100 to function like the word lines (WLs, not shown in the drawing), and then, the first region 100a of the substrate 100 may therefore be configured as a memory cell region and the second region 100b of the substrate 100 may therefore be configured as a periphery region. Then, a dielectric layer (not shown in the drawing) is formed on the substrate 100 and a plurality of bit lines (BLs, not shown in the drawing) and a plurality of plugs are further formed in the dielectric layer. The material layer 110 is then formed on the dielectric layer, and the material layer 110 may include a low-resistant metal material like W, Al or Cu. Through this performance, the aforementioned process in the present invention may be performed to pattern the material layer 110, thereby forming each patterns 127, 129a, 129b, 129c, 129d. That is, each of the patterns 129a formed within the first region 100a may be directly in contact with the plugs respectively underneath, and the patterns 129a may be further in connection with a transistor of the semiconductor memory device via the plugs, so as to function like a storage node contact (SNC). On the other hands, the patterns 127, 129b, 129c, 129d disposed within the second region 100b are not in connection with the plugs or in connection with dummy plugs. However, the method of the present invention is not limited to be applied to the semiconductor memory process above, and in another embodiment, the method may also be applied to other semiconductor processes for forming smaller, more densely packed layout or semiconductor structure under a cost-saving and simplified process flow by using fewer photomasks.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising: a substrate, having a first region; and a material layer disposed on the substrate, the material layer comprising a plurality of first patterns and a plurality of second patterns arranged in an array, and two third patterns, the plurality of first patterns being disposed within the first region, the plurality of second patterns being disposed at two opposite outer sides of the first region, and the two third patterns being disposed at a top and a bottom outer sides of the first region, wherein each of the third patterns partially merges each of a part of the plurality of first patterns and each of a part of the plurality of second patterns.

2. The semiconductor device according to claim 1, wherein a size of each of the plurality of second patterns is greater than a size of each of the plurality of first patterns.

3. The semiconductor device according to claim 1, wherein a size of each of the third patterns is greater than the sizes of each of the plurality of second pattern.

4. The semiconductor device according to claim 1, wherein each of the plurality of first patterns are separately and regularly arranged to form a plurality of first columns in a first direction, and the first patterns arranged in each first column are alternately arranged with each other in a second direction being perpendicular to the first direction.

5. The semiconductor device according to claim 4, wherein each of the plurality of second patterns are separately and regularly arranged to form a plurality of second columns in the first direction, and the second patterns arranged in each second column are in alignment with each other in the second direction.

6. The semiconductor device according to claim 5, wherein the first patterns are alternately arranged with adjacent second patterns in the second direction.

7. The semiconductor device according to claim 4, wherein each of the third patterns only merges the first patterns arranged in odd columns.

8. The semiconductor device according to claim 4, wherein each of the third patterns only merges the first patterns arranged in even columns.

9. The semiconductor device according to claim 1, wherein the substrate further comprises a second region surrounding the first region, and the plurality of second patterns and the third patterns are disposed within the second region.

10. The semiconductor device according to claim 1, further comprising:
 a plurality of bit lines disposed on the substrate, below the material layer; and
 a plurality of plugs disposed on the substrate, each of the plugs in connection with each of the plurality of first patterns.

11. A method of forming semiconductor device, comprising:
 providing a substrate having a first region;
 forming a material layer on the substrate; and
 patterning the material layer to forming a plurality of first patterns and a plurality of second patterns arranged in an array, and two third patterns, wherein the plurality of first patterns are formed within the first region, the plurality of second patterns are formed at two opposite outer sides of the first region, and the two third patterns are formed at a top and a bottom outer sides of the first region, and each of the third patterns partially merges each of a part of the plurality of first patterns and each of a part of the plurality of second patterns.

12. The method of forming a semiconductor device according to claim 11, further comprising:
 forming a plurality of first photomask patterns on the material layer, each of the first photomask patterns comprises a first portion extending along a first direction and a second portion extending along a second direction which is not perpendicular to the first direction;
 forming a plurality of second photomask patterns on the material layer, each of the second photomask patterns comprises a third portion extending along the first direction and a fourth portion extending along a third direction which is not perpendicular to the first direction;
 forming two third photomask patterns on the material layer, each of the third photomask patterns partially overlapping each of a part of the first photomask patterns and each of a part of the second photomask patterns; and
 patterning the material layer through the first photomask patterns, the second photomask patterns and the third photomask patterns.

13. The method of forming a semiconductor device according to claim 12, wherein the first portion of each of the first photomask patterns and the third portion of each of the first photomask patterns are completely overlapped with each other.

14. The method of forming a semiconductor device according to claim 12, wherein the first portion of each of the first photomask patterns and the third portion of each of the first photomask patterns are partially overlapped with each other.

15. The method of forming a semiconductor device according to claim 12, wherein a cross angle between the first direction and the second direction is about 40-60 degrees.

16. The method of forming a semiconductor device according to claim 12, wherein a cross angle between the second direction and the third direction is about 60-80 degrees.

17. The method of forming a semiconductor device according to claim 12, wherein the second portions of the first photomask patterns are paralleled with each other, and the fourth portions of the second photomask patterns are paralleled with each other.

18. The method of forming a semiconductor device according to claim 12, wherein the second portion of each of the first photomask patterns crosses through the fourth portion of each of the second photomask patterns.

19. The method of forming a semiconductor device according to claim 11, further comprising:
 forming a plurality of bit lines on the substrate, below the material layer; and forming a plurality of plugs on the substrate, the plugs and the bit lines being alternately disposed on the substrate, wherein the plurality of first patterns are connected to the plugs respectively.

20. The method of forming a semiconductor device according to claim 11, wherein the substrate further comprises a second region surrounding the first region, and the plurality of second patterns and the third patterns are formed within the second region.

* * * * *